(12) United States Patent
Darmann et al.

(10) Patent No.: US 6,916,991 B2
(45) Date of Patent: Jul. 12, 2005

(54) SUPERCONDUCTING TAPES

(75) Inventors: Francis Anthony Darmann, Mount Kuring-Gai (AU); Rupeng Zhao, Carlingford (AU)

(73) Assignee: Metal Manufacturing Limited (AU)

( * ) Notice: Subject to any disclaimer, the term of this patent is extended or adjusted under 35 U.S.C. 154(b) by 0 days.

(21) Appl. No.: 10/678,226

(22) Filed: Oct. 6, 2003

(65) Prior Publication Data

US 2004/0069526 A1 Apr. 15, 2004

Related U.S. Application Data

(63) Continuation of application No. 09/661,253, filed on Sep. 13, 2000, now abandoned, which is a continuation of application No. PCT/AU99/00179, filed on Mar. 18, 1999.

(30) Foreign Application Priority Data

Mar. 18, 1998 (GB) .............................................. 9805646

(51) Int. Cl.$^7$ .............................................. H01B 12/00
(52) U.S. Cl. ........................ 174/125.1; 29/599; 505/230
(58) Field of Search ........................ 174/125.1; 505/230, 505/231, 234, 926, 100, 237, 239; 29/599

(56) References Cited

U.S. PATENT DOCUMENTS

| | | | |
|---|---|---|---|
| 4,994,435 A | 2/1991 | Shiga et al. | |
| 5,059,582 A | * 10/1991 | Chung | ........................ 505/230 |
| 5,104,849 A | 4/1992 | Shiga et al. | |
| 5,122,507 A | 6/1992 | Yamamoto et al. | |
| 5,151,406 A | 9/1992 | Sawada et al. | |
| 5,189,260 A | 2/1993 | Finnemore et al. | |
| 5,192,739 A | 3/1993 | Lay | |
| 5,208,215 A | 5/1993 | Chen et al. | |
| 5,232,908 A | 8/1993 | Shiga et al. | |
| 5,288,699 A | 2/1994 | Sato et al. | |

(Continued)

FOREIGN PATENT DOCUMENTS

| | | |
|---|---|---|
| EP | 0 282 286 A2 | 9/1988 |
| EP | 0 356 969 A2 | 3/1990 |
| EP | 0 357 779 A1 | 3/1990 |
| JP | 10-223070 | 8/1998 |
| JP | 11-25771 | 1/1999 |
| JP | 11-25772 | 1/1999 |
| WO | WO 00/02208 | 1/2000 |
| WO | WO 01/71733 A1 | 9/2001 |

OTHER PUBLICATIONS

Abstract of Japanese Patent Publication No. 09259660; Oct. 3, 1997.

*Primary Examiner*—Randy Gibson
*Assistant Examiner*—Ishwar (I.B.) Patel
(74) *Attorney, Agent, or Firm*—Fay Kaplun & Marcin, LLP

(57) ABSTRACT

A composite superconducting tape including a multiplicity of constituent superconducting tapes stacked parallel to one another with major faces in contact, and at least some of constituent tapes have widths not greater than half the width of the composite superconductor and are laid edge to edge with each other. All constituent superconducting tapes may have a width that is substantially half, or another simple fraction, of the width of the composite tape so that they form two or more substacks with aligned zones between them which contain no superconducting material. A full-width tape of silver or silver alloy to bridge from tape to tape provides sufficiently strong mechanical connection between substacks. The composite superconducting tape has substantially improved critical current compared with a stack of the same overall dimensions and composition with all full-width superconducting tapes, due to magnetic de-coupling between the substacks.

16 Claims, 1 Drawing Sheet

U.S. PATENT DOCUMENTS

| | | | |
|---|---|---|---|
| 5,347,085 A | * | 9/1994 | Kikuchi et al. ............. 505/231 |
| 5,360,784 A | | 11/1994 | Kimura et al. |
| 5,398,398 A | | 3/1995 | Williams et al. |
| 5,508,254 A | | 4/1996 | Sato et al. |
| 5,516,573 A | * | 5/1996 | George et al. ............. 428/143 |
| 5,516,753 A | | 5/1996 | Ohkura et al. |
| 5,625,332 A | * | 4/1997 | Kamo et al. ................ 335/216 |
| 5,801,124 A | | 9/1998 | Gamble et al. |
| 5,846,910 A | | 12/1998 | Funahashi et al. |
| 5,849,670 A | | 12/1998 | Nabatame et al. |
| 5,929,000 A | | 7/1999 | Hahakura et al. |
| 5,987,342 A | | 11/1999 | Scudiere et al. |
| 6,074,991 A | | 6/2000 | Jenovelis et al. |
| 6,110,873 A | | 8/2000 | Duperray et al. |
| 6,192,573 B1 | | 2/2001 | Hahakura et al. |
| 6,271,474 B1 | | 8/2001 | Fujikami et al. |
| 6,272,730 B1 | | 8/2001 | Gherardi et al. |
| 6,272,731 B1 | | 8/2001 | Leriche et al. |
| 6,284,979 B1 | | 9/2001 | Malozemoff et al. |
| 6,305,069 B1 | | 10/2001 | Fujikami et al. |
| 6,344,430 B1 | | 2/2002 | Duperray et al. |
| 6,349,226 B1 | * | 2/2002 | Yoshino et al. ............. 505/230 |
| 6,360,425 B1 | | 3/2002 | Christopherson et al. |
| 6,370,405 B1 | | 4/2002 | Riley, Jr. et al. |
| 6,381,832 B1 | | 5/2002 | Kaneko |
| 6,387,852 B1 | | 5/2002 | Celik et al. |
| 6,397,454 B1 | * | 6/2002 | Seuntjens et al. ............. 29/599 |
| 6,442,827 B1 | * | 9/2002 | Herrmann et al. ............ 29/599 |
| 6,444,917 B1 | * | 9/2002 | Scudiere et al. ......... 174/125.1 |
| 6,466,805 B2 | | 10/2002 | Balachandran et al. |
| 6,469,253 B1 | | 10/2002 | Saga et al. |
| 6,507,746 B2 | * | 1/2003 | Kaneko ...................... 505/231 |
| 6,600,939 B1 | * | 7/2003 | Zhao .......................... 505/231 |
| 6,642,182 B2 | * | 11/2003 | Kaneko ...................... 505/431 |

* cited by examiner

SUPERCONDUCTING TAPES

CROSS REFERENCE TO RELATED APPLICATIONS

This is a continuation application of application Ser. No. 09/661,253 filed Sep. 13, 2000 now abandoned, which is a continuation of application Ser. No. PCT/AU99/00179, filed Mar. 18, 1999, the entire contents of which are hereby incorporated by reference for all purposes, and which claims foreign priority under 35 U.S.C. 119 to British Application 9805646.8 filed Mar. 18, 1998, the entire contents of which are also incorporated herein by reference for all purposes.

FIELD OF THE INVENTION

The present invention relates to a superconducting tape and more particularly to a composite superconducting tape.

BACKGROUND OF THE INVENTION

The invention has been developed primarily for carrying alternating current and will be described hereinafter with reference to that application. It will be appreciated, however, that the invention is not limited to that particular field of use and is also suitable for carrying direct or non periodically varying current.

Tapes comprising superconducting material, and referred to as superconducting tapes, are already known, and comprise one or many superconducting filaments in a medium of silver or silver alloy. Superconducting tapes are used to make coils, magnets, transformers, motors and generators as well as current carrying cables. The main class of superconducting tape is referred to as powder-in-tube or PiT tape. This tape is made by drawing or otherwise reducing a tube of silver, or less usually silver alloy, which is filled with a powder form of a superconducting oxide. The tube is then subjected to further rolling to form it into a thin tape. Multifilamentary tapes are mostly made by grouping a plurality of filled tubes in a common silver or silver alloy sheath at an intermediate stage of reduction.

One important superconducting oxide is known as Bi-2223. This oxide includes bismuth, strontium, calcium, and copper and, as would be known to those in the art, certain limited substitutions can be made. This oxide can be considered a cuprate salt.

Known tapes usually have a thickness of between around 0.2 mm and 0.3 mm, and a width of between 2 mm and 5 mm. The superconducting filaments must be thin to obtain an adequate critical current. A typical thickness is around 10 to 40 microns. Moreover, a typical aspect ratio is at least 1:10.

The filaments comprise many plate-like grains and, for good performance, the grains should be, as much as possible, aligned in the same crystallographic orientation. The relative orientation is often referred to as the grain alignment or "texture". Thin, well textured filaments allow a high critical current and give overall flexibility to the whole tape.

Composite tapes are sometimes made by forming a stack of individual tapes and wrapping the stack with one or more metal tapes to keep it together. These metal tapes are usually of silver or silver alloy. In U.K. patent application no. 9805641.9 in the name of the same applicant there has been proposed an improved form of composite tape in which the individual tapes are diffusion bonded, eliminating the need for the metal wrapping tape. This allows the elimination of the inevitable gaps and overlapping between the turns of the wrapping tape that create kinks in the filaments that destroy local grain alignment. As foreshadowed above, a reduction in alignment leads to a degradation of the overall critical current density $J_c$.

DISCLOSURE OF THE INVENTION

It is an object of the present invention, at least in the preferred embodiment, to overcome or substantially ameliorate one or more of the disadvantages of the prior art, or to provide a useful alternative.

According to the invention there is provided a composite superconducting tape comprising a multiplicity of constituent superconducting tapes stacked parallel to one another with major faces in contact, and is characterized in that at least some of the constituent tapes have widths not greater than half the width of the composite superconductor and are laid edge to edge with each other, the composite superconducting tape including at least one tape bridging the stacks.

According to another aspect of the invention, there is provided a composite superconducting tape constructed from a plurality of superconducting tapes, each having two opposite major faces and two opposite edges extending between the major faces, the composite superconducting tape including a first stack having a plurality of the superconducting tapes wherein each tape in the first stack has at least one major face in contact with a major face of an adjacent superconducting tape in that stack, a second stack having a plurality of the superconducting tapes wherein each tape in the second stack has at least one major face in contact with a major face of an adjacent superconducting tape in that stack, wherein at least some of the superconducting tapes have widths not greater than half the width of the composite superconducting tape, and a bridging tape spanning between the two stacks for maintaining the first and second stacks in a substantially parallel edge-to-edge configuration.

Preferably, all the constituent superconducting tapes have a width that is substantially half, or another simple fraction, of the width of the composite tape so that they form two or more substacks with aligned zones between them which contain no superconducting material. This will normally require the addition of a full-width tape of silver or silver alloy to bridge from stack to stack, to provide sufficiently strong mechanical connection between the stacks. Preliminary experiments indicate that this structure has substantially lower AC losses compared with a stack of the same overall dimensions and composition with all full-width superconducting tapes. While the inventors do not wish to be bound by any theory, it is thought that this observation may be accounted for by magnetic de-coupling between the stacks.

Preferably also, the full-width metal tape is at one end of the stack. More preferably, two full-width metal tapes are provided, one at each end of the stack. Even more preferably, if there is only one metal tape or two tapes are unequal strength, that the metal tape is used in a construction in which the tape, or the stronger tape respectively, is always on the convex side of any curve, as more fully explained in U.K. patent application no. 9805644.3.

In some embodiments one full-width superconducting tape is used.

Preferably, the superconducting tape is diffusion-bonded and all its elongate components extend longitudinally, as described in UK patent application no. 9805641.9.

In a preferred form, a metal tape is used which is flat and has a width not substantially greater than that of the superconducting tapes. In some embodiments the width of the metal tape is slightly less than that of the superconducting tapes. In still further embodiments, however, a wider metal tape is used which is, or subsequently becomes, bent to a channel section. Although the latter arrangement would have structural advantages it would adversely affect fill factor. Similarly, the use of a silver foil or other compatible material wrapped around the stack but extending longitudinally is not excluded.

Preferably, diffusion bonding of the superconducting tapes and, if present, the metal tapes, is achieved by assembling the tapes face to face and heat-treating at a temperature low enough to avoid any deleterious effect on the superconducting material. When the superconducting material has a typical BSCCO-2223 composition, the temperature should not exceed 842° C. Provided control is close enough, a temperature of 840° C. is recommended.

A diffusion time at temperature of several hours will be required to achieve adequate bonding. It will be appreciated, however, that excessively long periods are undesirable as tending to produce too much sintering of the superconductor material.

Preferably the diffusion-bonded stack of tapes is rolled to reduce overall thickness and to strengthen the bonding.

Unless the context clearly requires otherwise, throughout the description and the claims, tile words 'comprise', 'comprising', and the like are to be construed in an inclusive sense as opposed to an exclusive or exhaustive sense; that is to say, in the sense of "including, but not limited to".

BRIEF DESCRIPTION OF THE DRAWINGS

Preferred embodiments of the invention will now be described, by way of example only, with reference to the accompanying diagrammatic drawings (not to scale) in which.

PREFERRED EMBODIMENTS OF THE INVENTION

Figure 1:
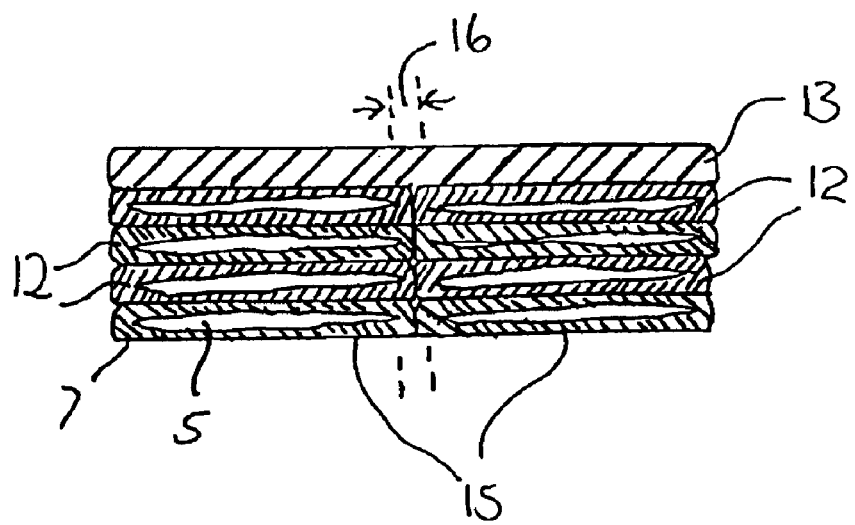
FIG. 1 is a cross-section of a composite superconducting tape according to the invention.

The composite superconducting tape shown in FIG. 1 has a width of between 4 and 5.5 mm and a thickness of about 0.27 mm and comprises (for example) eight stacked monofilamentary tapes 12 bonded together. Each monofilamentary tape 12 comprises a filament 5 of superconducting material, for example, BSCCO-2223 in a silver/silver alloy cladding 7 as with known superconducting tapes. Typical, in the finished product as shown, each individual monofilamentary tape 12 has a thickness of 50 $\mu$m and the filaments 5 themselves have typical thicknesses of 10 to 40 $\mu$m. The constituent tapes 12 each have a width substantially equal to half the width of the composite tape and they are arranged with a full-width silver bridging tape 13 in two sub-stacks 15 with a zone 16 between them that is substantially free of superconductor filaments.

Figure 2:
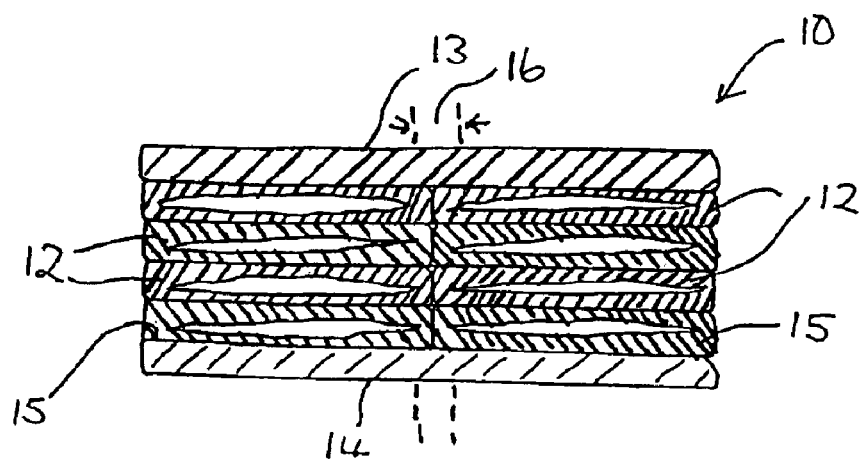
FIG. 2 is a cross-section of another embodiment of a composite superconducting tape according to the invention.

The tape of FIG. 2 is similar except that there are silver and/or silver alloy tapes 13 and 14 at both the top and bottom ends of the stack.

To make either of the superconducting multifilamentary tapes shown in the drawings, the required number of monofilamentary tapes 12 must be made. The monofilamentary tapes 12 are made by firstly packing BSCCO-2223 oxide powder (or more usually a precursor convertible to the Bi-2223 composition by heat-treatment) into a cleaned and dry tube of silver or silver alloy having an internal diameter of approximately 8 mm and an external diameter of approximately 10 mm. A length of between 4 cm and 6 cm—depending upon the length of the silver tube—at one end of the tube is then swaged, and the tip of the swaged end closed off using smaller swaging dies, to prevent powder loss during packing. After swaging, the tube is again dried. The prepared tube is then carefully filled with the superconducting powder (precursor) under dry argon in a glove box. The powder is added small amounts at a time and tamped down with a silver rod until the tube is full, at which point the tube is closed off using a plug of silver tape. After the tube has been packed with superconducting powder and sealed, then the tube is degassed by placing it in a cool oven, in air, raising the temperature to 830° C. and maintaining that temperature for five hours. The tube is then drawn in a number of stages down to a diameter of approximately 1.11 mm. The drawing is done in 27 steps in each of which the cross-sectional area of the tube is reduced by approximately 15%. During drawing, the tube is twice annealed at 500° C. for between 30 and 60 seconds, when its diameter is 2.51 mm and 1.96 mm.

The 1.11 mm wire is then rolled in a rolling mill with a roll diameter of 200 mm, in stages to successive smaller thicknesses using roll gaps of 0.80, 0.65, 0.50, 0.40, 0.35, 0.30, 0.25 and 0.22 mm, twice annealing for between 30 and 60 seconds at 500° C., at thicknesses of 0.65 mm and 0.35 mm.

The tape is then cut into eight strips of equal length and stacked in two stacks as shown with one or two metal tapes (about 0.22 mm thick) as required and the stack of tapes wound on a former of ceramic material (with ceramic paper strip interleaved to prevent bonding of turns). It may be desirable to square the edges of the taps (by trimming or otherwise) before stacking to minimise risk of creating voids between the columns. The tapes are then heated at 840° C. for about five hours to effect diffusion bonding and then, after being cooled to room temperature, rolled in stages to 0.32 mm using successive roll gaps of 1.00 (when there are two metal tapes), 0.80, 0.65, 0.55, 0.45, 0.38, 0.35, and 0.32 mm, annealing under the same conditions as before at 0.80 mm and 0.55 mm.

The composite tape is, then heated in air, starting with a cool oven, to 840° C. and held at that temperature for 50 hours, cooled to room temperature and rolled once on the same mill with a roll gap of 0.28 mm. Finally it is heat-treated in an atmosphere of 7.5% oxygen balance nitrogen, starting with a cold oven, heated to 825° C., held at that temperature for 40 hours and then cooled over a further period of 40 hours to 785° C. This heat-treatment regime serves to consolidate it, complete texturing and convert the precursor to the desired BSCCO-2223 phase without risking melting of any large volume fraction of the superconducting material.

The embodiment described above has used eight monofilamentary constituent tapes 12 and has a final thickness between 0.25 and 0.3 mm. However, more or fewer tapes can be used and the width, thickness and number of sub-stacks varied depending upon the application of the tape and the revelant (but conflicting) requirements for capacity and flexibility. In most cases the balance of thicknesses and rolling reduction should be such that the filament thickness is generally in the range 10–40 $\mu$m, but preferably close to the lower end of that range.

Twisted (or untwisted) multifilamentary tapes, if desired with different numbers of filaments, different pitches and/or different twisting sense or direction, could also be stacked and bonded together and provided with or without the outer layers of silver/silver alloy such as bridging tape 13 and 14, but the invention is not expected to show the same benefits for twisted tapes as for untwisted ones.

Although the invention has been described with reference to specific examples it will be appreciated by those skilled in the art that it may be embodied in many other forms.

What is claimed is:

1. A composite superconducting tape comprising a multiplicity of constituent superconducting tapes stacked parallel to one another with major faces in contact so as to form a series of stacks, and wherein at least some of the constituent superconducting tapes have widths not greater than half a width of the composite superconducting tape and are laid edge to edge with each other, the composite superconducting tape including at least one tape bridging the stacks and wherein the constituent composite superconducting tapes are interbonded by interfusion.

2. A composite superconducting tape as claimed in claim 1, in which all the constituent superconducting tapes have a width that is substantially a simple fraction of the width of the composite superconducting tape so that the constituent superconducting tapes form two or more stacks with aligned zones therebetween which contain no superconducting material.

3. A composite superconducting tape as claimed in claim 2, in which the simple fraction is a half, so that there are two stacks.

4. A composite superconducting tape as claimed in claim 1, wherein the at least one bridging tape is a full width of the composite superconducting tape and is produced from a silver or silver alloy material.

5. A composite superconducting tape as claimed in claim 4, wherein there are at least two full-width metal bridging tapes, one bridging tape at one end of the stacks and a second bridging tape at another end of the stacks.

6. A composite superconducting tape as claimed in claim 5, wherein respective bending moment strengths of the two full-width metal tapes are unequal.

7. A composite superconducting tape as claimed in claim 1, in which the composite superconducting tape is diffusion-bonded and all elongate components extend longitudinally.

8. A composite superconducting tape as claimed in claim 1, in which the constituent superconducting tapes are all powder-in-tube superconducting tapes.

9. A composite superconducting tape constructed from a plurality of superconducting tapes each having two opposite major faces and two opposite edges extending between the major faces, the composite superconducting tape including:

a first stack having a plurality of the superconducting tapes wherein each superconducting tape in the first stack has at least one major face in contact with a major face of an adjacent superconducting tape in the first stack;

a second stack having a plurality of superconducting tapes wherein each superconducting tape in the second stack has a least one major face in contact with a major face of an adjacent superconducting tape in the second stack, wherein at least some of the superconducting tapes have widths not greater than half a width of the composite superconducting tape; and at least one bridging tape spanning between the first and second stacks for maintaining the first and second stacks in a substantially parallel edge-to-edge configuration, wherein the constituent composite superconducting tapes are interbonded by infusion.

10. A composite superconducting tape as claimed in claim 9, wherein all the superconducting tapes have a width that is substantially a simple fraction of the width of the composite superconducting tape so that the superconducting tapes form at least the first and second stacks with aligned zones therebetween which contain no superconducting material.

11. A composite superconducting tape as claimed in claim 10, wherein said simple fraction is a half, so that there are two stacks.

12. A composite superconducting tape as claimed in claim 9, wherein the bridging tape is a full width of the composite superconducting tape and is produced from a silver or silver alloy material.

13. A composite superconducting tape as claimed in claim 12, wherein there are at least two full-width metal bridging tapes, one bridging tape at one end of the stacks and a second bridging tape at another end of the stacks.

14. A composite superconducting tape as claimed in claim 13, wherein the respective bending moment strengths of the two full-width metal tapes are unequal.

15. A composite superconducting tape as claimed an claim 9, wherein the composite superconducting tape is diffusion-bonded and all elongate components extend longitudinally.

16. A composite superconducting tape as claimed in claim 9, in which the superconducting tapes are all powder-in-tube superconducting tapes.

* * * * *